(12) United States Patent
Levy

(10) Patent No.: US 9,323,014 B2
(45) Date of Patent: Apr. 26, 2016

(54) HIGH-SPEED OPTICAL MODULE WITH FLEXIBLE PRINTED CIRCUIT BOARD

(75) Inventor: Shmuel Levy, Kiryat Tivon (IL)

(73) Assignee: MELLANOX TECHNOLOGIES LTD., Yokneam (IL)

( * ) Notice: Subject to any disclaimer, the term of this patent is extended or adjusted under 35 U.S.C. 154(b) by 685 days.

(21) Appl. No.: 13/481,874

(22) Filed: May 28, 2012

(65) Prior Publication Data
US 2013/0315528 A1    Nov. 28, 2013

(51) Int. Cl.
*G02B 6/36* (2006.01)
*G02B 6/42* (2006.01)
*H05K 1/18* (2006.01)
*H05K 1/14* (2006.01)

(52) U.S. Cl.
CPC ............... *G02B 6/425* (2013.01); *H05K 1/181* (2013.01); *G02B 6/4214* (2013.01); *G02B 6/4281* (2013.01); *H05K 1/147* (2013.01); *H05K 1/189* (2013.01); *H05K 2201/09072* (2013.01); *H05K 2201/10121* (2013.01); *Y02P 70/611* (2015.11); *Y10T 29/4913* (2015.01)

(58) Field of Classification Search
None
See application file for complete search history.

(56) References Cited

U.S. PATENT DOCUMENTS

| | | |
|---|---|---|
| 4,130,343 A | 12/1978 | Miller et al. |
| 4,337,759 A | 7/1982 | Popovich et al. |
| 4,703,984 A | 11/1987 | Mitchell |
| 4,979,787 A | 12/1990 | Lichtenberger |
| 5,073,003 A | 12/1991 | Clark |
| 5,404,869 A | 4/1995 | Parkyn, Jr. et al. |
| 5,446,815 A | 8/1995 | Ota et al. |
| 5,571,754 A | 11/1996 | Bertin et al. |
| 5,917,976 A | 6/1999 | Yamaguchi |
| 5,987,202 A * | 11/1999 | Gruenwald et al. ............ 385/49 |
| 6,132,107 A | 10/2000 | Morikawa |
| 6,293,688 B1 | 9/2001 | Deacon |
| 6,345,138 B1 | 2/2002 | Kawai et al. |
| 6,456,766 B1 | 9/2002 | Shaw et al. |
| 6,491,447 B2 | 12/2002 | Aihara |
| 6,504,107 B1 * | 1/2003 | Kragl ............................ 174/260 |
| 6,567,574 B1 | 5/2003 | Ma et al. |
| 6,635,866 B2 | 10/2003 | Chan et al. |

(Continued)

FOREIGN PATENT DOCUMENTS

JP    2006235262 A    9/2006

OTHER PUBLICATIONS

U.S. Appl. No. 13/366,326, filed Feb. 5, 2012.
(Continued)

Primary Examiner — Tina Wong
(74) Attorney, Agent, or Firm — D. Kligler I.P. Services Ltd.

(57) ABSTRACT

An apparatus includes a base substrate, a light rotation module and a flexible printed circuit board (PCB). The light rotation module has a bottom surface mounted on the base substrate and a top surface coupled to one or more optoelectronic transducers, and is configured to direct optical signals between the respective optoelectronic transducers and optical ports on a side perpendicular to the top surface. The flexible printed circuit board (PCB) includes a first end that is attached to the top surface of the light rotation module and has the optoelectronic transducers mounted thereon, a second end attached to the base substrate, and conductive traces disposed between the first and second ends to direct electrical signals between the optoelectronic transducers and the base substrate.

22 Claims, 3 Drawing Sheets

(56) References Cited

U.S. PATENT DOCUMENTS

| | | | |
|---|---|---|---|
| 6,697,399 B2 | 2/2004 | Kimura et al. | |
| 6,721,187 B2 | 4/2004 | Hall et al. | |
| 6,741,777 B2 | 5/2004 | Jewell et al. | |
| 6,817,782 B2 | 11/2004 | Togami et al. | |
| 6,841,739 B2 | 1/2005 | Moore | |
| 6,888,984 B2 | 5/2005 | Abeles et al. | |
| 6,898,347 B2* | 5/2005 | Junnarkar et al. | 385/31 |
| 7,040,814 B2 | 5/2006 | Morimoto et al. | |
| 7,049,704 B2 | 5/2006 | Chakravorty et al. | |
| 7,091,062 B2 | 8/2006 | Geyer | |
| 7,265,719 B1 | 9/2007 | Moosbrugger et al. | |
| 7,267,553 B2 | 9/2007 | Sone | |
| 7,289,701 B2* | 10/2007 | Lam et al. | 385/49 |
| 7,306,378 B2* | 12/2007 | Alduino et al. | 385/88 |
| 7,350,985 B2 | 4/2008 | Laughlin et al. | |
| 7,420,262 B2 | 9/2008 | Bauer et al. | |
| 7,474,815 B2* | 1/2009 | Budd | G02B 6/42 385/129 |
| 7,515,415 B2 | 4/2009 | Monfarad et al. | |
| 7,538,358 B2 | 5/2009 | Badehi et al. | |
| 7,665,905 B2* | 2/2010 | Tamura | G02B 6/4201 385/78 |
| 7,665,911 B2 | 2/2010 | Hamazaki | |
| 7,885,499 B2 | 2/2011 | Blauvelt et al. | |
| 7,887,243 B2 | 2/2011 | Abel et al. | |
| 8,043,877 B2 | 10/2011 | Badehi et al. | |
| 8,115,302 B2 | 2/2012 | Andry et al. | |
| 8,144,473 B2 | 3/2012 | Yumoto et al. | |
| 8,244,124 B2 | 8/2012 | Nguyen | |
| 8,265,432 B2* | 9/2012 | Doany | G02B 6/4201 257/432 |
| 8,272,788 B2 | 9/2012 | Ohta | |
| 8,315,287 B1 | 11/2012 | Roggero et al. | |
| 8,363,988 B2* | 1/2013 | Kim et al. | 385/14 |
| 8,723,102 B2* | 5/2014 | Unterborsch et al. | 250/227.11 |
| 8,723,332 B2 | 5/2014 | McElrea et al. | |
| 2002/0114578 A1 | 8/2002 | Lin et al. | |
| 2002/0131471 A1 | 9/2002 | Sugiyama | |
| 2002/0149074 A1 | 10/2002 | Imaeda | |
| 2003/0086653 A1* | 5/2003 | Kuhara | G02B 6/4214 385/49 |
| 2003/0118288 A1* | 6/2003 | Korenaga et al. | 385/49 |
| 2003/0198439 A1 | 10/2003 | Hiramatsu | |
| 2004/0037497 A1 | 2/2004 | Lee | |
| 2004/0124523 A1 | 7/2004 | Poo et al. | |
| 2004/0126059 A1 | 7/2004 | Bhagavatula et al. | |
| 2004/0184727 A1 | 9/2004 | Liu et al. | |
| 2004/0207049 A1 | 10/2004 | Bauer et al. | |
| 2005/0100264 A1* | 5/2005 | Kim et al. | 385/14 |
| 2006/0008214 A1 | 1/2006 | Giboney et al. | |
| 2007/0248139 A1 | 10/2007 | Bischel et al. | |
| 2007/0258676 A1* | 11/2007 | Windover | H04B 10/801 385/14 |
| 2008/0031629 A1 | 2/2008 | Nguyen et al. | |
| 2008/0128864 A1 | 6/2008 | Cho | |
| 2009/0189258 A1 | 7/2009 | Mariani et al. | |
| 2010/0271689 A1 | 10/2010 | Jasapata | |
| 2011/0116741 A1 | 5/2011 | Cevini et al. | |
| 2011/0243511 A1* | 10/2011 | Tong | G02B 6/3817 385/88 |
| 2012/0020619 A1 | 1/2012 | Kadar-Kallen et al. | |
| 2012/0051685 A1 | 3/2012 | Su et al. | |
| 2012/0076454 A1* | 3/2012 | Shiraishi | 385/14 |
| 2012/0224814 A1 | 9/2012 | Hirano et al. | |
| 2013/0084039 A1 | 4/2013 | Doany et al. | |
| 2013/0136885 A1 | 5/2013 | Fujii et al. | |
| 2013/0156386 A1 | 6/2013 | Miller | |
| 2013/0223789 A1* | 8/2013 | Lee et al. | 385/14 |
| 2013/0294721 A1* | 11/2013 | Lee | G02B 6/428 385/14 |

OTHER PUBLICATIONS

U.S. Appl. No. 13/419,447, filed Mar. 14, 2012.
U.S. Appl. No. 13/419,449, filed Mar. 14, 2012.
U.S. Appl. No. 13/369,324, filed Feb. 9, 2012.
U.S. Appl. No. 13/532,829, filed Jun. 26, 2012.
Connected Fibers, LLC., "MT Ferrules", Datasheet, Jan. 2009.
Lee et al., "Silicon Optical Bench for Transmitter Module", Department of Optics and Photonics, National Central University, Taiwan, Oct. 19, 2009.
"Glass and Silicon Packages Webinar", Georgia Institute of Technology, 3D-Systems Packaging Research Center, Atlanta, USA, Jul. 21, 2010.
Micralyne, Inc., "MEMS Optical Components", Apr. 5, 2012.
Eldada et al., "Advances in Polymer Integrated Optics", IEEE Journal of Selected Topics in Quantum Electronics, vol. 5, No. 1, pp. 54-68, Jan./Feb. 2000.
U.S. Appl. No. 13/369,324 Office Action dated Nov. 4, 2013.
U.S. Appl. No. 13/366,326 Office Action dated Mar. 27, 2014.
U.S. Appl. No. 13/731,025 Office Action dated Mar. 20, 2014.
U.S. Appl. No. 13/677,374 Office Action dated Jan. 30, 2014.
International Electrotechnical Commision, "Fiber Optic Connector Interfaces—Part 5: Type MT Connector Family", IEC document No. IEC61754-5, second edition, 32 pages, Jul. 2005.
Lagziel et al., U.S. Appl. No. 13/851,178, filed Mar. 27, 2012.
Levy et al., U.S. Appl. No. 13/677,374, filed Nov. 15, 2012.
Levy et al., U.S. Appl. No. 13/731,025, filed Dec. 30, 2012.
Stockham et al., "Assembly of micro-optical systems with mechanical positioning", Proceedings of the SPIE, Optomechatronic Micro/Nano Devices and Components II, 637609, Oct. 13, 2006.
U.S. Appl. No. 13/532,829 Office Action dated Oct. 4, 2013.
U.S. Appl. No. 13/366,326 Office Action dated Oct. 25, 2013.
U.S. Appl. No. 13/851,178 Office Action dated Aug. 29, 2014.
International Application # PCT/IB2014/060688 Search Report dated Aug. 18, 2014.
U.S. Appl. No. 13/419,449 Office Action dated Oct. 6, 2014.
U.S. Appl. No. 13/935,515 Office Action dated Jan. 21, 2015.
U.S. Appl. No. 13/935,511 Office Action dated Jan. 21, 2015.
U.S. Appl. No. 13/935,515 Office Action dated Dec. 8, 2015.
U.S. Appl. No. 13/935,511 Office Action dated Nov. 10, 2015.

\* cited by examiner

US 9,323,014 B2

HIGH-SPEED OPTICAL MODULE WITH FLEXIBLE PRINTED CIRCUIT BOARD

FIELD OF THE INVENTION

The present invention relates generally to optical communications, and particularly to high-speed optical modules.

BACKGROUND OF THE INVENTION

Optical modules integrating optical fibers with optoelectronic transducers, such as semiconductor lasers and photodiodes, are utilized, for example, in high data rate, high bandwidth communication systems. These modules may be fabricated using a variety of hybrid assembly techniques, which sometimes require high precision alignment processes when directing the light in the optical fiber core to the optoelectronic transducer.

U.S. Pat. Nos. 7,538,358 and 8,043,877, whose disclosures are incorporated herein by reference, describe a packaged electro-optic integrated circuit and a multi-mode fiber connector including an integrated circuit substrate, at least one optical signal providing element, at least one optical signal sensor, sensing at least one optical signal from the at least one optical signal providing element and at least one discrete reflecting optical element, mounted onto the integrated circuit substrate, cooperating with the at least one optical signal providing element and being operative to direct light from the at least one optical signal providing element.

SUMMARY OF THE INVENTION

An embodiment of the present invention provides an apparatus including a base substrate, a light rotation module, and a flexible printed circuit board (PCB). The light rotation module has a bottom surface mounted on the base substrate and a top surface coupled to one or more optoelectronic transducers, and is configured to direct optical signals between the respective optoelectronic transducers and optical ports on a side perpendicular to the top surface. The flexible printed circuit board (PCB) includes a first end that is attached to the top surface of the light rotation module and has the optoelectronic transducers mounted thereon, a second end attached to the base substrate, and conductive traces disposed between the first and second ends to direct electrical signals between the optoelectronic transducers and the base substrate.

In some embodiments, the light rotation module includes a silicon optical bench formed by a Si interposer fabrication process. In some embodiments, the light rotation module includes one or more mirrors configured to direct the optical signals between the respective optoelectronic transducers and the optical ports. In other embodiments, the one or more mirrors are slanted. Yet in other embodiments, the one or more mirrors are curved. In some embodiments, the one or more mirrors include respective optical gratings. In other embodiments, the apparatus can also include respective lenses coupled to the one or more mirrors.

In some embodiments, the first end of the flexible PCB is aligned with the top surface of the light rotation module, and the second end of the flexible PCB is aligned with the bottom surface of the light rotation module. In other embodiments, the optical ports include one or more optical fibers placed in respective holes formed in the side perpendicular to the top surface of the light rotation module.

In other embodiments, the optoelectronic transducers are fabricated in a transducer die that is mounted onto the first end of the flexible PCB, and include a driver die that is mounted adjacent to the transducer die at the first end, and circuit traces that are disposed on the flexible PCB for connecting the transducer die with the driver die. Yet in other embodiments, the apparatus may also include an optical parallel connector attached to the optical ports.

There is also provided, in accordance with an embodiment of the present invention, a method including mounting a bottom surface of a light rotation module onto a base substrate. A first end of a flexible printed circuit board (PCB), having one or more optoelectronic transducers mounted thereon, is attached to a top surface of the light rotation module, so as to direct optical signals between the optoelectronic transducers and respective optical ports on a side of the light rotation module that is perpendicular to the top surface. A second end of the flexible PCB is attached to the base PCB. Conductive traces are disposed between the first and second ends so as to direct electrical signals between the optoelectronic transducers and the base substrate.

The present invention will be more fully understood from the following detailed description of the embodiments thereof, taken together with the drawings in which:

DETAILED DESCRIPTION OF EMBODIMENTS

Overview

Network communication systems, such as Infiniband network elements, can comprise optoelectronic-based connectivity or switching components, such as Enhanced Data Rate (EDR) active optical cables, EDR optical module switches and EDR Host Channel Adapter (HCA) optical modules. These optical components typically comprise optical benches, which are often regarded as the lowest hierarchical optical building blocks, comprising an optical fiber array which is interfaced to an optoelectronic transducer array. Optoelectronic transducers may comprise, for example, lasers to generate light and photodetectors to detect light, which is routed in optical fibers between the elements of the communication system.

Optical modules may also comprise interconnects which couple control and processing signals from one integrated circuit chip to another chip comprising the optoelectronic transducers. For example, a photodiode on an optoelectronic transducer (OT) die detects modulated light and converts the light signal to a modulated current. The electrical ports of the OT die are then coupled to an auxiliary (AUX) die comprising a trans-impedance amplifier (TIA) circuitry to convert the modulated current to a voltage. Some conventional optical modules wire bond the AUX die to the OT die. As a result, the modulation bandwidth is limited to about 25 GBps due to the parasitic inductance of the wire bond degrading the signal integrity of the modulation current signal at OT output (e.g., photodiode output) to the input of the AUX die (e.g., TIAs).

Embodiments of the present invention that are described herein provide an optical module apparatus with improved optical modulation bandwidth. In some embodiments, a light rotation module is mounted on a base substrate, such as a base printed circuit board (PCB). The light rotation module comprises a silicon optical bench (SiOB) formed in a silicon substrate, which is configured to direct light perpendicularly between multiple optical ports on a side of the SiOB and a top surface of the SiOB. The optical ports typically comprise an optical fiber array formed in the side of the SiOB perpendicular to the top surface of the SiOB.

An optoelectronic transducer die and an auxiliary die are mounted (e.g., using flip-chip mounting) in close proximity to one another, at one end of a flexible PCB attached to the top surface of the SiOB. The opposite end of the flexible PCB is attached to the base substrate, alongside the light rotation module.

The optical ports are typically connected to an optical parallel connector. Conducting traces on the flexible PCB connect the auxiliary die to the base substrate on which the entire optical module is mounted. Having all of the optical and electrical interfaces on a single flexible PCB simplifies assembly and significantly reduces both the parasitic capacitance and inductance in the connection between the OT die and the AUX die improving the modulation bandwidth significantly.

System Description

Figure 1:
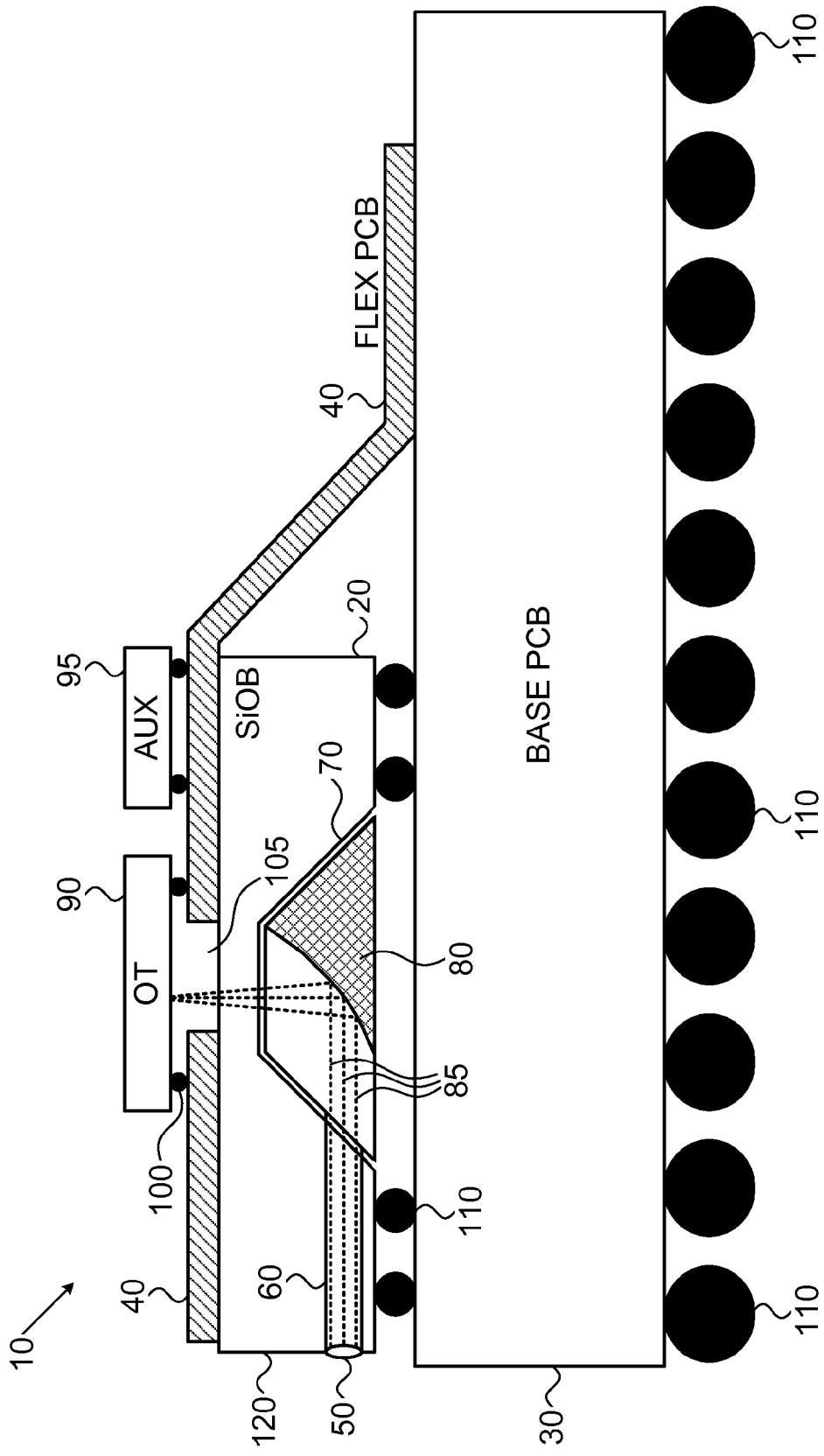
FIG. 1 is a diagram showing a cross-sectional view of a high-speed optical module, in accordance with an embodiment of the present invention.
Figure 2:
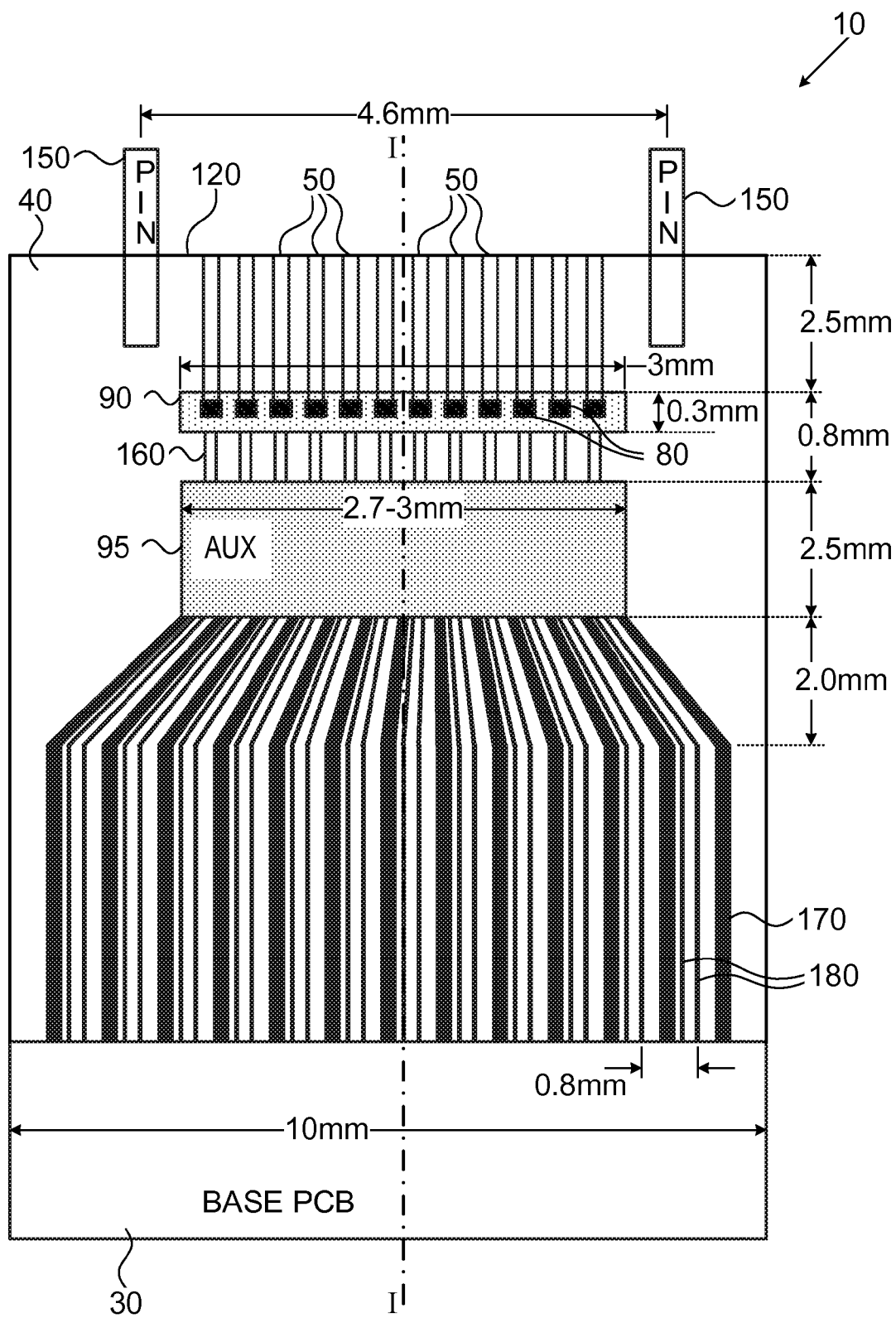
FIG. 2 is a diagram showing a top view of a high-speed optical module, in accordance with an embodiment of the present invention.

FIG. 1 is a diagram showing a cross-sectional view of a high speed optical module 10, in accordance with an embodiment of the present invention. A top view of module 10 is shown in FIG. 2 below. Module 10 comprises a silicon optical bench (SiOB) 20, whose bottom surface is attached to a base printed circuit board (PCB) 30, or any other suitable base substrate. The first end of a flexible PCB 40 is attached to the top surface of SiOB 20, and the opposite second end is attached to base PCB 30.

A perpendicular side 120 of SiOB 20 comprises optical ports. For the example shown here, the optical ports comprise multimode optical fibers 50, which are placed in respective embedded fiber holes 60 formed in the SiOB perpendicular to side 120 and parallel to the top surface of the SiOB. Holes 60 may be formed, for example, by chemical etching, reactive ion etching, mechanical drilling, or any other suitable process.

In the fabrication of light rotation module 20 for the embodiment shown in FIG. 1, a groove 70 is etched into the SiOB, for example by a mechanical saw, chemical etching or any other suitable etch process, which cuts the substrate material and the fiber edge on a bevel. Holes 60 in which the fibers are placed typically do not extend to the opposite face of the SiOB, but are configured to end where groove 70 is etched, which forms a bevel cut of the fiber edge facet.

A micro-optical mirror 80 is placed in groove 70. Mirror 80 is aligned and configured to direct a light ray 85 between an optoelectronic transducer (OT) die 90 (e.g., a vertical cavity surface emitting laser (VCSEL) die or a photodiode die) placed on the top surface of the flexible PCB and embedded fiber 50 with the beveled edge facet.

Optoelectronic transducer die 90 typically comprises one or more Gallium Arsenide (GaAs) vertical cavity surface emitting lasers (VCSELs) or photodiodes, which are mounted onto the flexible PCB by flip chip bumps 100. Optoelectronic transducer die 90 may also comprise an array of VCSEL or photodiode devices on the same die. The flexible PCB comprises a hole 105 directly under the VCSEL, enabling light to pass unhindered between the VCSEL and mirror 80 directly beneath. The mirror then rotates the light perpendicularly and directs the light into the respective fiber 50.

In the present context, the term "optoelectronic transducer" refers to a VCSEL, a photodiode or any other suitable of transducer used for converting between optical and electrical signals.

An auxiliary (AUX) die 95 is mounted on flex PCB 40, e.g., by flip-chip attachment, adjacent to OT die 90. The AUX die may be fabricated utilizing processes such as complementary metal oxide semiconductor (CMOS), silicon germanium (SiGe) or any other suitable semiconductor process. When the optoelectronic transducers comprise optical emitters such as VCSELs, the AUX die comprises respective drivers that generate electrical signals for driving the optical emitters. When the optoelectronic transducers comprise optical detectors such as photodiodes, the AUX die comprises amplifiers such as Trans-impedance Amplifiers (TIAs) for amplifying the electrical signals produced by the optical detectors.

SiOB 20 can be attached to the base substrate by any suitable attachment process. Similarly, base PCB 30 can be attached to any other substrate by solder bumps 110, or by any other suitable attachment process. Flexible PCB 40 may comprise, for example, Megtron-6 PPE Blend Resin Films manufactured by Matrix, Inc. (Santa Ana, Calif.), N4000-13EP films manufactured by Nelco California (Fullerton, Calif.), or any other suitable flexible PCB materials. The base PCB may comprise FR4 or any other suitable PCB materials.

FIG. 2 is a diagram showing a top view of high-speed optical module 10, in accordance with an embodiment of the present invention. The top view also superimposes embedded fibers 50 as shown in the cross-sectional view of FIG. 1 for conceptual clarity. Typical dimensions of the optical module are shown in FIG. 2, which are in no way a limitation of the embodiments of the present invention. Any other suitable dimensions can be used in implementing modules supporting modulation frequencies ranging from 25 GHz to 50 GHz, for example.

The optical module in the present example comprises twelve optical fibers 50 embedded in respective fiber holes 60 (shown in FIG. 1 above) in the SiOB, twelve corresponding micro-optical mirrors 80 placed in groove 70 (shown in FIG. 1 above), which direct light between the fibers and optoelectronic transducer die 90. Module 10 may also comprise pins 150, which can be embedded into the SiOB and utilized to mechanically support an optical parallel connector (not shown in FIG. 2) mounted onto face 120 of base PCB 30. The width of the base PCB is typically up to 10 mm.

In some embodiments, die 90 may comprise twelve separate VCSEL dies or one die comprising an array of twelve VCSEL devices. In some embodiments, the optoelectronic transducer die can comprise an array of photodiodes. The embodiments shown in FIG. 1 and FIG. 2 are purely for conceptual clarity and not by way of limitation of the embodiments of the present invention.

AUX die 95 is mounted as close as possible to OT die 90, for example by mounting both dies by flip chip attachment or in any other suitable way. AUX die 95 typically has dimensions of 2.7-3 mm by 1.5-3 mm as shown in FIG. 2. Conductive electrical traces 160 are disposed on the surface of flex PCB 40 connecting AUX die 95 to OT die 90. The width of the optoelectronic transducer die is typically 3 mm. The height of die 90 plus the length of the traces 160 is typically 0.4-0.8 mm as shown in FIG. 2. Mounting dies 90 and 95 in such close proximity enables traces 160 to be as short as possible, typically less than 0.5 mm. This sort of configuration maintains the integrity of the electrical modulation signal between the AUX die and the OT die by minimizing electrical parasitics, thereby increasing the achievable modulation bandwidth of the light.

Differential conductive traces on the flex PCB are used to drive the circuits fabricated on AUX die 95. The differential traces are formed by thick ground traces 170 surrounding signal traces 180. Twelve differential trace pairs then route into the AUX die as shown in FIG. 2. The conductive traces route the electrical signals between the end of flex PCB 40 where dies 95 and 90 are located, and the opposite end of the flex PCB that connects to base PCB 30.

Proper design of the conductive traces comprising multiple pairs of differential transmission lines connect the AUX die to a electrical connector, or any suitable electrical interface, ensures high signal integrity and continuity of the electrical modulation signal between the electrical interface and the optoelectronic transducer.

In the embodiment shown in FIG. 1 and FIG. 2, the light rotation module can be formed using Si interposer fabrication process, or formed by the techniques described in U.S. Pat. Nos. 7,538,358 and 8,043,877, cited above. In some embodiments, mirror 80 can be fabricated by etching Si, glass, or any appropriate optical material, and by depositing a layer of gold, or any other appropriate reflective materials to form the micro-optical mirror with the desired form factor. In other embodiments, the mirror can be formed by any appropriate fabrication technique to embed and self-align the mirror within the light rotation module so as to direct light 85 between fibers 50 and OT die 90.

In some embodiments, mirror 80 placed in groove 70 may comprise an array of twelve micro-optical mirrors. In other embodiments, the mirror may comprise a flat slanted mirror, a curved slanted mirror (as shown in FIG. 1), or a combination of a lens and a mirror. Yet in other embodiments, the mirror may also comprise an optical grating integrated into the embodiments discussed above. The curved mirror, lens and grating embodiments can be used to collimate light rays 85 into and out of fiber 50 as shown in FIG. 1.

The mechanical and geometrical configuration of module 10 shown in FIGS. 1 and 2 is an example configuration that is shown purely for the sake of conceptual clarity. In alternative embodiments, any other suitable configuration can be used.

Figure 3:
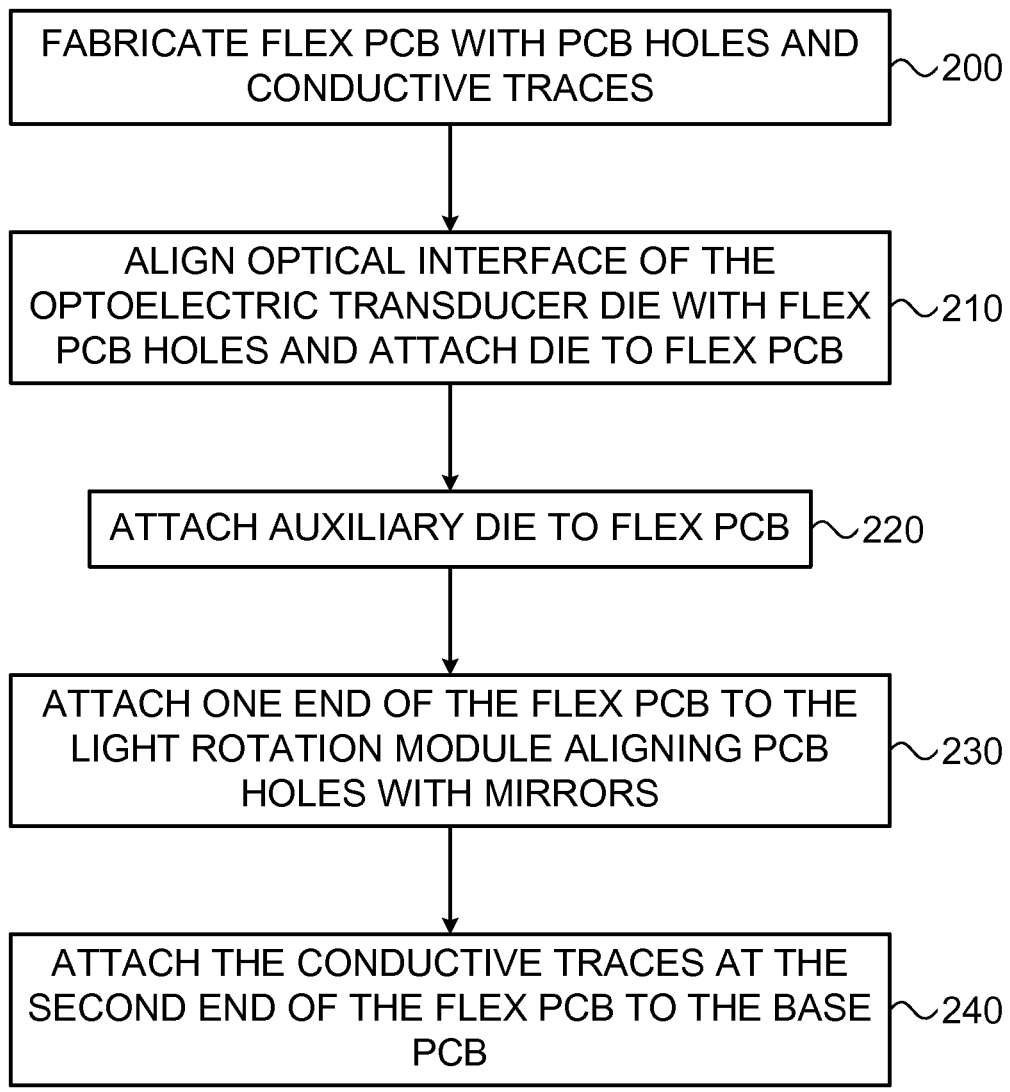
FIG. 3 is a flow chart that schematically illustrates a method for fabricating a high-speed optical module, in accordance with an embodiment of the present invention.

FIG. 3 is a flow chart that schematically illustrates a method for fabricating high-speed optical module 10, in accordance with an embodiment of the present invention. At a fabrication step 200, flex PCB 40 is fabricated with PCB holes 105 and conductive traces 170 and 180. At an alignment step 210, the optical interfaces of optoelectronic transducer die 90 (e.g., a VCSEL or photodiode array die) are aligned with flex PCB holes 105, and die 90 is attached to flex PCB 40. At an attachment step 220, auxiliary die 95 is attached to flex PCB 40. The AUX die may comprise driver circuitry if paired with an OT die comprising VCSEL devices, or conversely, trans-impedance amplifiers if paired with an OT die comprising photodiodes.

At an attachment step 230, one end of the flex PCB is attached to the top face of light rotation module (e.g., SiOB 20), while aligning PCB holes 105 with mirrors 80. At an attachment step 240, conductive traces 170 and 180 at the opposite end of flex PCB 40 are attached to base PCB 30. Electrical traces 170 and 180 can then be attached to any electrical connector or other components on base PCB 30. Similarly, any suitable optical parallel connector can be mounted on face 120 as previously described.

The order of steps in the method of FIG. 3 is chosen by way of example. In alternative embodiments, module 100 may be fabricated using any other suitable order of steps.

It will thus be appreciated that the embodiments described above are cited by way of example, and that the present invention is not limited to what has been particularly shown and described hereinabove. Rather, the scope of the present invention includes both combinations and sub-combinations of the various features described hereinabove, as well as variations and modifications thereof which would occur to persons skilled in the art upon reading the foregoing description and which are not disclosed in the prior art. Documents incorporated by reference in the present patent application are to be considered an integral part of the application except that to the extent any terms are defined in these incorporated documents in a manner that conflicts with the definitions made explicitly or implicitly in the present specification, only the definitions in the present specification should be considered.

The invention claimed is:

1. An apparatus, comprising:
   a base substrate;
   a silicon optical bench, which has a bottom surface mounted on the base substrate and a top surface coupled to one or more optoelectronic transducers;
   a flexible printed circuit board (PCB), which comprises a first end that is attached to the top surface of the silicon optical bench and has the optoelectronic transducers mounted thereon, a second end attached to the base substrate, and conductive traces disposed between the first and second ends to direct electrical signals between the optoelectronic transducers and the base substrate; and
   wherein the silicon optical bench is configured to direct optical signals between the respective optoelectronic transducers and optical ports on a side perpendicular to the top surface through PCB holes formed in the flexible PCB.

2. The apparatus according to claim 1, wherein the silicon optical bench is formed by a Si interposer fabrication process.

3. The apparatus according to claim 1, wherein the silicon optical bench comprises one or more mirrors configured to direct the optical signals between the respective optoelectronic transducers and the optical ports.

4. The apparatus according to claim 3, wherein the one or more mirrors are slanted.

5. The apparatus according to claim 3, wherein the one or more mirrors are curved.

6. The apparatus according to claim 3, and comprising respective lenses coupled to the one or more mirrors.

7. The apparatus according to claim 3, wherein the one or more mirrors comprise respective optical gratings.

8. The apparatus according to claim 1, wherein the first end of the flexible PCB is aligned with the top surface of the silicon optical bench, and wherein the second end of the flexible PCB is aligned with the bottom surface of the silicon optical bench.

9. The apparatus according to claim 1, wherein the optical ports comprise one or more optical fibers placed in respective holes formed in the side perpendicular to the top surface of the silicon optical bench.

10. The apparatus according to claim 1, wherein the optoelectronic transducers are fabricated in a transducer die that is mounted onto the first end of the flexible PCB, and comprising a driver die that is mounted adjacent to the transducer die at the first end, and circuit traces that are disposed on the flexible PCB for connecting the transducer die with the driver die.

11. The apparatus according to claim 1, and further comprising an optical parallel connector attached to the optical ports.

12. A method, comprising:
mounting a bottom surface of a silicon optical bench onto a base substrate;
forming PCB holes in a first end of a flexible printed circuit board (PCB);
attaching the first end of the flexible PCB, having one or more optoelectronic transducers mounted thereon, to a top surface of the silicon optical bench, so as to direct optical signals between the optoelectronic transducers and respective optical ports on a side of the silicon optical bench that is perpendicular to the top surface through the PCB holes formed in the flexible PCB;
attaching a second end of the flexible PCB to the base PCB; and
disposing conductive traces between the first and second ends so as to direct electrical signals between the optoelectronic transducers and the base substrate.

13. The method according to claim 12, wherein the silicon optical bench is formed by a Si interposer fabrication process.

14. The method according to claim 12, wherein the silicon optical bench comprises one or more mirrors configured to direct the optical signals between the respective optoelectronic transducers and the optical ports.

15. The method according to claim 14, wherein the one or more mirrors are slanted.

16. The method according to claim 14, wherein the one or more mirrors are curved.

17. The method according to claim 14, wherein the one or more mirrors comprise respective lenses.

18. The method according to claim 14, wherein the one or more mirrors comprise respective optical gratings.

19. The method according to claim 12, wherein attaching the first end of the flexible PCB comprises aligning the first end with the top surface of the silicon optical bench, and wherein attaching the second end of the flexible PCB comprises aligning the second end with the bottom surface of the silicon optical bench.

20. The method according to claim 12, wherein the optical ports comprise one or more optical fibers placed in respective holes formed in the side perpendicular to the top surface of the silicon optical bench.

21. The method according to claim 12, and comprising mounting onto the first end of the flexible PCB a driver die and a transducer that comprises the optoelectronic transducers, and connecting the driver die with the transducer die with circuit traces disposed on the flexible PCB.

22. The method according to claim 12, and comprising attaching an optical parallel connector to the optical ports.

* * * * *